US010936455B2

United States Patent
Yazovitsky et al.

(10) Patent No.: US 10,936,455 B2
(45) Date of Patent: Mar. 2, 2021

(54) RECOVERY OF DATA FAILING DUE TO IMPAIRMENT WHOSE SEVERITY DEPENDS ON BIT-SIGNIFICANCE VALUE

(71) Applicant: Apple Inc., Cupertino, CA (US)

(72) Inventors: Eli Yazovitsky, Netanya (IL); Eyal Gurgi, Petach-Tikva (IL); Michael Tsohar, Givat Shmuel (IL)

(73) Assignee: APPLE INC., Cupertino, CA (US)

( * ) Notice: Subject to any disclaimer, the term of this patent is extended or adjusted under 35 U.S.C. 154(b) by 129 days.

(21) Appl. No.: 16/271,907

(22) Filed: Feb. 11, 2019

(65) Prior Publication Data

US 2020/0257598 A1      Aug. 13, 2020

(51) Int. Cl.
*G06F 11/20* (2006.01)

(52) U.S. Cl.
CPC ...... *G06F 11/2094* (2013.01); *G06F 2201/82* (2013.01)

(58) Field of Classification Search
CPC ...... G06F 11/20; G06F 11/2094; G06F 11/18; G06F 11/10; G06F 11/30; G06F 11/14
USPC ........................................................ 714/6.12
See application file for complete search history.

(56) References Cited

U.S. PATENT DOCUMENTS

| | | |
|---|---|---|
| 4,841,482 A | 6/1989 | Kreifels |
| 5,181,025 A | 1/1993 | Ferguson et al. |
| 5,331,594 A | 7/1994 | Hotta |
| 5,372,712 A | 12/1994 | Petit |
| 5,428,621 A | 6/1995 | Mehrotra et al. |
| 5,440,516 A | 8/1995 | Slemmer |
| 5,581,509 A | 12/1996 | Golla et al. |
| 5,602,778 A | 2/1997 | Futatsuya et al. |
| 5,606,527 A | 2/1997 | Kwack et al. |
| 5,684,747 A | 11/1997 | Urai |
| 5,748,545 A | 5/1998 | Lee et al. |
| 5,796,653 A | 8/1998 | Gaultier |
| 5,847,995 A | 12/1998 | Kobayashi et al. |
| 5,898,637 A | 4/1999 | Lakhani et al. |
| 6,031,772 A | 2/2000 | Nagatomo |
| 6,545,910 B2 | 4/2003 | Byeon et al. |

(Continued)

OTHER PUBLICATIONS

U.S. Appl. No. 16/202,130 office action dated Jan. 8, 2020.

(Continued)

*Primary Examiner* — Kamini B Patel
(74) *Attorney, Agent, or Firm* — Kligler & Associates Patent Attorneys Ltd

(57) ABSTRACT

A controller includes an interface and storage circuitry. The interface communicates with a memory that includes memory cells that store data in multiple programming levels, and that are organized in Word Lines (WLs). Each WL connects to one or more cell-groups of the memory cells. The memory cells in some cell-groups suffer from an impairment that has a different severity for reading data units of different bit-significance values. The storage circuitry assigns multiple parity groups to data units stored in cell-groups belonging to consecutive WLs, so that a same parity group is assigned to data units of different bit-significance values in neighboring groups of Nwl consecutive WLs. Upon detecting a failure to access a data unit of a given parity group, due to the impairment, the storage circuitry recovers the data unit using other data units assigned to the given parity group, and that are stored in other cell-groups.

18 Claims, 5 Drawing Sheets

(56) References Cited

U.S. PATENT DOCUMENTS

| | | |
|---|---|---|
| 6,650,585 B2 | 11/2003 | Chevallier |
| 6,707,078 B1 | 3/2004 | Shiraiwa et al. |
| 6,813,183 B2 | 11/2004 | Chevallier |
| 7,089,460 B2 | 8/2006 | Fu |
| 7,212,454 B2 | 5/2007 | Kleveland et al. |
| 7,319,623 B1 | 1/2008 | Yuan et al. |
| 7,440,347 B1 | 10/2008 | Vogelsang |
| 7,463,529 B2 | 12/2008 | Matsubara |
| 7,856,528 B1 | 12/2010 | Frost et al. |
| 7,873,803 B2 | 1/2011 | Cheng |
| 8,176,284 B2 | 5/2012 | Frost et al. |
| 8,305,807 B2 | 11/2012 | Shah et al. |
| 8,379,454 B2 | 2/2013 | Kochar et al. |
| 8,432,732 B2 | 4/2013 | Li et al. |
| 8,473,780 B2 | 6/2013 | Shalvi |
| 8,478,796 B2 | 7/2013 | Post et al. |
| 8,514,630 B2 | 8/2013 | Huynh et al. |
| 8,645,749 B2 | 2/2014 | Reche |
| 8,645,776 B2 | 2/2014 | Byom et al. |
| 8,730,722 B2 | 5/2014 | Koh et al. |
| 8,732,557 B2 | 5/2014 | Ratnam et al. |
| 8,767,459 B1 | 7/2014 | Kasorla et al. |
| 8,775,901 B2 | 7/2014 | Sharon et al. |
| 8,832,357 B2 | 9/2014 | Yao et al. |
| 8,892,981 B2 | 11/2014 | Post et al. |
| 8,902,657 B2 | 12/2014 | Iwai et al. |
| 8,977,813 B2 | 3/2015 | Burd |
| 9,021,339 B2 | 4/2015 | Lu et al. |
| 9,021,343 B1 | 4/2015 | Hu et al. |
| 9,032,272 B2 | 5/2015 | Yoon et al. |
| 9,053,809 B2 | 6/2015 | Anholt et al. |
| 9,058,261 B1 | 6/2015 | Jean et al. |
| 9,092,363 B2 | 7/2015 | Avila et al. |
| 9,105,349 B2 | 8/2015 | Avila et al. |
| 9,128,822 B2 | 9/2015 | Michael et al. |
| 9,135,112 B2 | 9/2015 | Chen et al. |
| 9,177,610 B2 | 11/2015 | D'Abreu et al. |
| 9,330,783 B1 * | 5/2016 | Rotbard ............... G11C 29/025 |
| 9,355,713 B2 | 5/2016 | Huang et al. |
| 9,390,809 B1 | 7/2016 | Shur et al. |
| 9,406,346 B2 | 8/2016 | D'Abreu et al. |
| 9,454,429 B2 | 9/2016 | Ojalvo et al. |
| 9,489,263 B2 | 11/2016 | Hyun et al. |
| 9,529,663 B1 | 12/2016 | Srinvasan et al. |
| 9,619,321 B1 | 4/2017 | Haratsch et al. |
| 9,811,413 B2 | 11/2017 | Ojalvo et al. |
| 9,847,141 B1 * | 12/2017 | Sagiv ................. G11C 29/028 |
| 9,928,126 B1 * | 3/2018 | Shappir ............... G06F 11/108 |
| 9,959,168 B2 | 5/2018 | Achtenberg et al. |
| 9,984,771 B2 | 5/2018 | Bonke |
| 9,996,417 B2 * | 6/2018 | Shappir ............... G06F 11/108 |
| 10,474,530 B2 * | 11/2019 | Yeh ...................... G06F 3/0658 |
| 10,740,476 B2 * | 8/2020 | Shappir ................ G06F 21/60 |
| 2002/0174295 A1 | 11/2002 | Ulrich et al. |
| 2008/0052446 A1 | 2/2008 | Lasser et al. |
| 2009/0157964 A1 * | 6/2009 | Kasorla ................. G11C 29/52 |
| | | 711/118 |
| 2009/0225607 A1 | 9/2009 | Chen et al. |
| 2010/0128525 A1 | 5/2010 | Mokhlesi |
| 2010/0329052 A1 | 12/2010 | Chen et al. |
| 2011/0066793 A1 | 3/2011 | Burd |
| 2011/0209028 A1 | 8/2011 | Post et al. |
| 2012/0148255 A1 * | 6/2012 | Liu ....................... H04B 10/50 |
| | | 398/136 |
| 2012/0159281 A1 | 6/2012 | Shalvi et al. |
| 2013/0024748 A1 | 1/2013 | Sharon et al. |
| 2013/0031429 A1 | 1/2013 | Sharon et al. |
| 2013/0117606 A1 | 5/2013 | Anholt et al. |
| 2013/0229868 A1 | 9/2013 | Koh et al. |
| 2013/0268724 A1 | 10/2013 | Seo et al. |
| 2013/0294168 A1 | 11/2013 | Shirakawa |
| 2014/0047291 A1 | 2/2014 | Shalvi et al. |
| 2014/0095259 A1 | 3/2014 | Tam et al. |
| 2014/0157078 A1 | 6/2014 | Danilak et al. |
| 2014/0189421 A1 | 7/2014 | Werner et al. |
| 2014/0189438 A1 | 7/2014 | Arbel et al. |
| 2014/0254264 A1 | 9/2014 | Dutta et al. |
| 2014/0269071 A1 | 9/2014 | Pandya et al. |
| 2014/0321202 A1 | 10/2014 | Yang et al. |
| 2015/0154069 A1 | 6/2015 | Tuers et al. |
| 2015/0178150 A1 | 6/2015 | Silberman et al. |
| 2016/0034353 A1 | 2/2016 | Tuers et al. |
| 2016/0098216 A1 | 4/2016 | Huang et al. |
| 2018/0203774 A1 * | 7/2018 | Srinivasan ......... G11C 16/3459 |
| 2019/0095116 A1 | 3/2019 | Igahara et al. |
| 2019/0198113 A1 | 6/2019 | Ben-Rubi et al. |
| 2019/0317672 A1 | 10/2019 | Linnen et al. |
| 2020/0005873 A1 * | 1/2020 | Yazovitsky ............ G11C 29/52 |
| 2020/0005874 A1 * | 1/2020 | Shappir ................. G11C 29/12 |

OTHER PUBLICATIONS

Shappir et al., U.S. Appl. No. 16/202,130, filed Nov. 28, 2018.
U.S. Appl. No. 16/202,127 office action dated Dec. 11, 2019.
Yazovitsky et al., U.S. Appl. No. 16/202,127, filed Nov. 28, 2018.

* cited by examiner

RECOVERY OF DATA FAILING DUE TO IMPAIRMENT WHOSE SEVERITY DEPENDS ON BIT-SIGNIFICANCE VALUE

TECHNICAL FIELD

Embodiments described herein relate generally to data storage, and particularly to methods and systems for recovering data failing in multiple word lines.

BACKGROUND

In various storage systems, a controller stores data in multiple memory devices using a redundant storage scheme supporting data recovery, such as, for example, a redundant array of independent disks (RAID) scheme. Methods for data recovery in nonvolatile storage systems are known in the art. For example, U.S. Pat. No. 9,996,417 describes a controller that communicates with a multi-plane memory comprising: multiple memory cells organized in at least two different memory planes that are accessible in parallel; and multiple word lines (WLs), wherein each WL traverses the different memory planes and is connected to respective cell-groups of the memory cells in the different memory planes, wherein in a first failure mode, two or more cell-groups belonging to different WLs fail but only in a single memory plane, and wherein in a second failure mode, a plurality of cell-groups belonging to a single WL fail in multiple memory planes; and a processor, which is configured to assign multiple cell-groups of the memory cells to a parity group, such that (i) no two cell-groups in the parity group belong to a same WL, and (ii) no two cell-groups in the parity group belong to adjacent WLs in a same memory plane, wherein the processor is further configured to, upon detecting a failure to access a cell-group in the parity group due to either the first failure mode or the second failure mode but not both the first and second failure modes simultaneously, recover data stored in the cell-group using one or more remaining cell-groups in the parity group.

SUMMARY

An embodiment that is described herein provides a controller, including an interface and storage circuitry. The interface is configured to communicate with a memory including multiple memory cells that store data in a number of programming levels higher than two. The memory cells are organized in multiple Word Lines (WLs), each WL connects to one or more cell-groups of the memory cells. The memory cells in some of the cell-groups suffer from an impairment that has a different severity for reading data units of different respective bit-significance values. The storage circuitry is configured to assign multiple parity groups to multiple data units stored in cell-groups belonging to multiple consecutive WLs, so that a same parity group is assigned to data units of different bit-significance values in neighboring groups of Nwl consecutive WLs, and upon detecting a failure to access a given data unit of a given parity group, due to the impairment, to recover the given data unit using one or more other data units assigned to the given parity group, and that are stored in cell-groups other than the cell-group storing the given data unit.

In some embodiments, the storage circuitry is configured to calculate redundancy data over the given data unit and the other data units, to store the redundancy data prior to reading the given data unit, and to recover the given data unit upon failure by retrieving the redundancy data and the other data units, and reproducing the given data unit based on the retrieved redundancy data and the other data units. In other embodiments, the impairment is caused due to memory cells in the given cell-group that are erased to an erasure programming level, but are read falsely as being programmed to a programming level other than the erasure programming level. In yet other embodiments, the impairment is caused due to a difference in temperature in programming and reading the memory cells of the given cell-group, causing a shift of an optimal setting of at least one read threshold beyond a voltage range that the memory supports for setting read thresholds.

In an embodiment, the data units span a cell-group defined in a list consisting of an entire WL, one or more data pages, and one or more code words (CWs) calculated using an error correction code (ECC). In another embodiment, the storage circuitry is configured to assign a number Npg of different parity groups to Npg respective data units stored in a group of Nwl consecutive WLs, in accordance with a first pattern, and to assign the Npg parity groups to data units stored in another group of Nwl consecutive WLs, in accordance with a second pattern including a permutation of the first pattern. In yet another embodiment, the memory cells in each WL are organized in multiple strings, and the storage circuitry is configured to assign a same parity group to data units belonging to different strings, in selected neighboring groups of Nwl consecutive WLs.

In some embodiments, the memory cells in each WL are organized in multiple planes, and the storage circuitry is configured to assign a same parity group to data units belonging to different planes, in selected neighboring groups of Nwl consecutive WLs. In other embodiments, the memory cells in each WL are organized in multiple strings and multiple planes, and the storage circuitry is configured to assign a same parity group to data units belonging to one of (i) different strings and same planes (ii) different planes and same strings or (iii) both different strings and different planes, in selected neighboring groups of Nwl consecutive WLs.

There is additionally provided, in accordance with an embodiment that is described herein, a method for data storage, including, in a controller that communicates with a memory including multiple memory cells that store data in a number of programming levels higher than two, the memory cells are organized in multiple Word Lines (WLs), each WL connects to one or more cell-groups of the memory cells, and the memory cells in some of the cell-groups suffer from an impairment that has a different severity for reading data units of different respective bit-significance values, assigning multiple parity groups to multiple data units stored in cell-groups belonging to multiple consecutive WLs, so that a same parity group is assigned to data units of different bit-significance values in neighboring groups of Nwl consecutive WLs. Upon detecting a failure to access a given data unit of a given parity group, due to the impairment, the given data unit is recovered using one or more other data units assigned to the given parity group, and that are stored in cell-groups other than the cell-group storing the given data unit.

These and other embodiments will be more fully understood from the following detailed description of the embodiments thereof, taken together with the drawings in which:

DETAILED DESCRIPTION OF EMBODIMENTS

Overview

Figure 1:
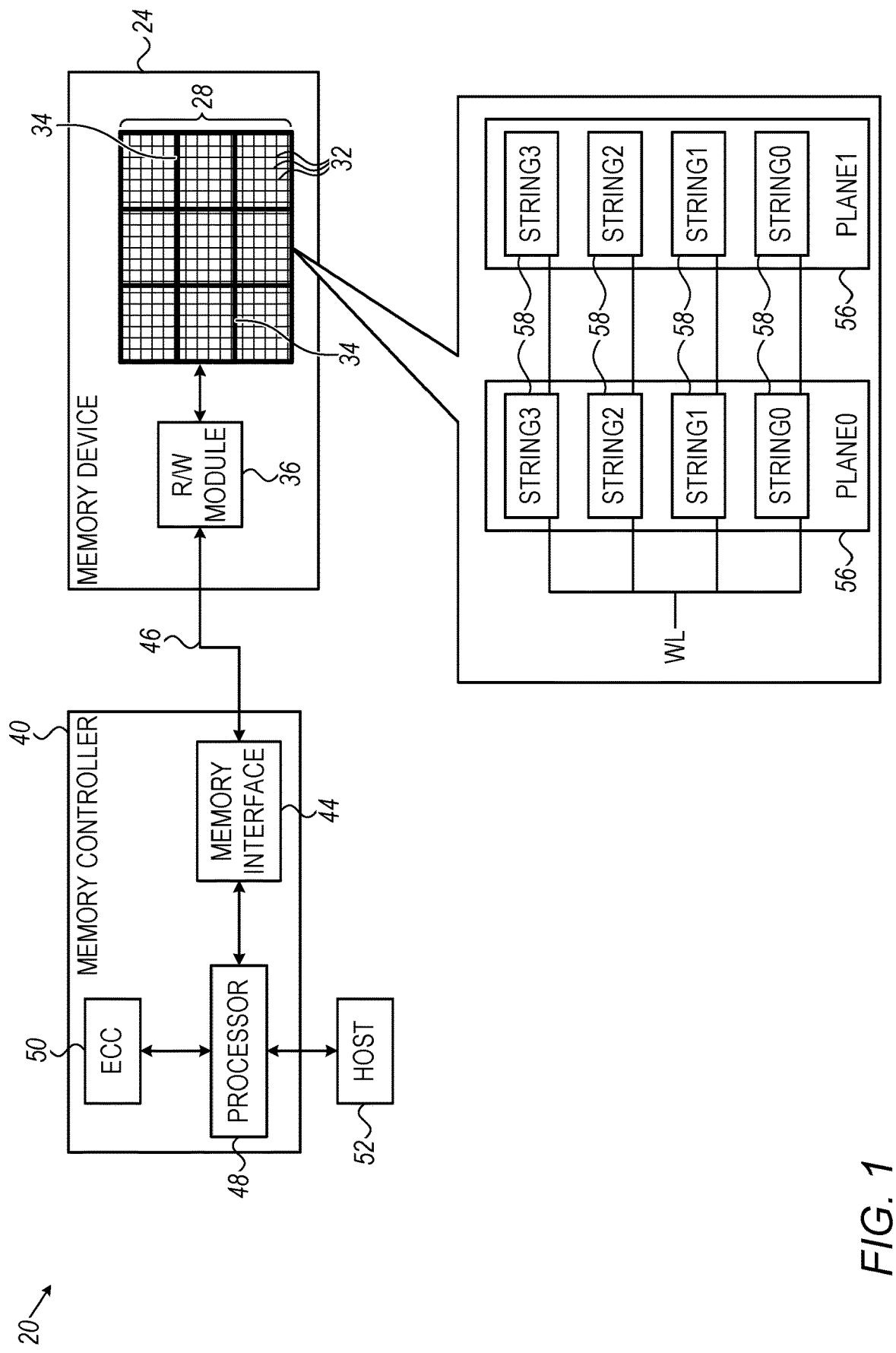
FIG. 1 is a block diagram that schematically illustrates a memory system, in accordance with an embodiment that is described herein.

Various storage systems comprise a controller that stores data in one or more memory devices. The memory devices comprise memory cells that are typically arranged in one or more arrays of rows and columns. A row of memory cells is also referred to as a word line (WL). In some embodiments, the memory cells are arranged in multiple sub-arrays such as "planes" that share a common WL. In a three-dimensional configuration, sub-arrays may comprise planes, "strings" or both.

The controller may store data to WLs in units that are referred to as data pages. In a multi-level cell (MLC) device, the controller stores both a least significant bit (LSB) page and a most significant bit (MSB) page to a group of memory cells, using two programming levels. Similarly, in a three-level cell (TLC) device, the controller stores a LSB data page, a MSB data page and an upper-significant (USB) page to a group of the memory cells, using eight programming levels. A quad-level cell (QLC) device can be programmed to assume one of sixteen possible programming levels.

Embodiments that are described herein provide methods and systems for recovering data in a nonvolatile memory, in which some of the memory cells may suffer from an impairment that has a different severity for reading data of different respective bit-significance values. Impairments of this sort are caused, for example, due to "erase penetration" or due to a difference in the temperatures between the time of programming and the time of reading, also referred to herein as "cross-temperature." In erase penetration, threshold voltages of erased memory cells are shifted to higher values and may be falsely interpreted as programmed to a programming level other than the erasure level. In a cross-temperature situation, an optimal setting of a read threshold may fall outside a supported range of read thresholds. In such cases, setting of a read threshold non-optimally may result in a read failure. The erase penetration impairment described above tends to cause read failures in multiple consecutive WLs, possibly in a common plane or string.

In the disclosed embodiments, the memory controller defines a recovery scheme that supports recovery of data that failed due to impairments such as erase penetration and cross-temperature that may occur over multiple consecutive WLs. The recovery scheme is defined for a certain type of data units that the controller reads from respective cell-groups in the memory. Each data unit corresponds to some bit-significance value. A data unit may span, for example, the memory cells of an entire WL, or part thereof such as, for example, one or more data pages, one or more code words (CW) that were encoded using a suitable error correction code (ECC).

In some embodiments, in defining the recovery scheme, the memory controller assigns a number Npg of parity groups to multiple data units stored in cell-groups belonging to multiple consecutive WLs, wherein a same parity group is assigned to data units of different bit-significance values in neighboring groups of Nwl consecutive WLs. For example, in an MLC device, a common parity group alternates between LSB data unit and MSB data unit in neighboring groups of Nwl consecutive WLs. Such alternation of the bit-significance value increases the number of consecutive WLs from Nwl to 2·Nwl that are recoverable with high probability. By alternating between two different data units (e.g., code words CW0 and CW1) every 2·Nwl consecutive WLs, the number of consecutive WLs that are recoverable with high probability increases to 4·Nwl, in this example. Alternatively, a recovery scheme can be designed, in which the number of parity groups reduces by a respective factor of two or four for protecting Nwl consecutive WLs.

Recovery schemes for TLC and QLC can be designed using similar principles. For example, in TLC and QLC, a common parity group alternates among data units of three (TLC) or four (QLC) bit-significance values in neighboring groups of Nwl consecutive WLs.

In some embodiments, the memory controller calculates redundancy data over multiple data units assigned to a given parity group, and that are stored in different respective cell-groups, and stores the calculated redundancy data, e.g., in the memory device. Upon detecting a failure to access a given data unit of the given parity group, due to the impairment, the memory controller recovers the given data unit by retrieving the redundancy data and the other data units used in calculating that redundancy data. The memory controller reproduces the given data unit based on the retrieved redundancy data and the other data units.

In some embodiments, the memory controller assigns Npg different parity groups to Npg respective data units stored in a group of Nwl consecutive WLs, in accordance with a first pattern, and further assigns these Npg parity groups to data units stored in another group of Nwl consecutive WLs, in accordance with a second pattern comprising a permutation of the first pattern.

In an embodiment, the memory controller assigns a same parity group to data units belonging to one of (i) different strings and same planes, (ii) different planes and same strings or (iii) both different strings and different planes, in selected neighboring groups of Nwl consecutive WLs.

In the disclosed techniques, a redundancy-based recovery scheme modifies the assignment of a parity group to data units having different bit-significance values, and possibly different physical dimension such as string and/or plane, in neighboring groups of Nwl consecutive WLs. In the disclosed recovery schemes, the number of consecutive WLs that are recoverable with high probability increases without increasing the number of parity groups required, and thus retaining low storage footprint for redundancy information.

System Description

FIG. 1 is a block diagram that schematically illustrates a memory system 20, in accordance with an embodiment that is described herein. Memory system 20 can be used in various host systems and devices, such as in computing devices, cellular phones or other communication terminals, removable memory modules, Solid State Disks (SSD), Secure Digital (SD) cards, Multi-Media Cards (MMC) and embedded MMC (eMMC), digital cameras, music and other media players and/or any other system or device in which data is stored and retrieved.

Memory system 20 comprises a Non-Volatile Memory (NVM) device 24, which stores data in a memory array 28 that comprises multiple memory cells 32, such as analog memory cells. The memory cells are arranged in multiple memory blocks 34. In the context of the present patent application, the term "analog memory cell" is used to describe any memory cell that holds a continuous, analog value of a physical parameter, such as an electrical voltage or charge. Memory array 28 may comprise solid-state memory cells 32 of any kind, such as, for example, NAND, NOR and Charge Trap Flash (CTF) Flash cells, phase change RAM (PRAM, also referred to as Phase Change Memory—PCM), Nitride Read Only Memory (NROM), Ferroelectric RAM (FRAM) or Resistive RAM (RRAM). Although the embodiments described herein refer mainly to analog memory, the disclosed techniques may also be used with various other memory types.

The charge levels stored in the memory cells and/or the analog voltages or currents written into and read out of the memory cells are referred to herein collectively as analog values, storage values or analog storage values. Although the embodiments described herein mainly address threshold voltages, the methods and systems described herein may be used with any other suitable kind of storage values. In the description that follows, the terms "analog values" and "threshold voltages" are used interchangeably.

Memory system 20 stores data in analog memory cells 32 by programming the memory cells to assume respective memory states, which are also referred to as programming levels. The programming levels are selected from a finite set of possible levels, and each programming level corresponds to a certain nominal storage value. For example, a 2 bit/cell Multi-Level Cell (MLC) can be programmed to assume one of four possible programming levels by writing one of four possible nominal storage values into the cell. Similarly, a 3 bit/cell device and a 4 bit/cell device, also referred to as a Triple-Level Cell (TLC) and Quad-Level Cell (QLC), can be programmed to assume one of eight and one of sixteen possible programming levels, respectively. A memory cell that stores a single bit (i.e., using two programming levels) is also referred to as a Single-Level Cell (SLC).

Memory device 24 comprises a reading/writing (R/W) module 36, which converts data for storage in the memory device to analog storage values and writes them into memory cells 32. In alternative embodiments, the R/W module does not perform the conversion, but is provided with voltage samples, i.e., with the storage values for storage in the memory cells. When reading data out of memory array 28, R/W module 36 converts the storage values of memory cells 32 into digital samples having an integer resolution of one or more bits. Data is typically written to and read from the memory cells in data units that are referred to as data pages (or simply pages, for brevity).

For reading a data page, the R/W module typically sets one or more read thresholds, e.g., at about mid-points between adjacent nominal programming levels, and senses the threshold voltages of the memory cells relative to the read thresholds. In some embodiments, the R/W module supports setting read thresholds only within a predefined range of voltages.

Memory system 20 comprises a memory controller 40 that performs storage and retrieval of data in and out of memory device 24. Memory controller 40 comprises a memory interface 44 for communicating with memory device 24, a processor 48, and an error correction code (ECC) module 50. The memory controller communicates with the memory device via memory interface 44 over a communication link 46. Communication ink 46 may comprise any suitable link or communication bus, such as, for example, a PCIe bus.

In some embodiments, the memory controller communicates with the memory device storage commands such as erase, program and read command. The memory controller may communicate with the memory device control commands, e.g., for configuring read thresholds. The disclosed techniques can be carried out by memory controller 40, by R/W module 36, or both. Thus, in the present context, memory controller 40 and R/W module 36 are referred to collectively as "storage circuitry" that carries out the disclosed techniques.

Memory controller 40 communicates with a host 52, for accepting data for storage in the memory device and for outputting data retrieved from the memory device. In some embodiments, ECC module 50 encodes the data for storage using a suitable ECC and decodes the ECC of data retrieved from the memory. ECC module 50 may comprise any suitable type of ECC, such as, for example, Low Density Parity Check (LDPC), Reed-Solomon (RS) or Bose-Chaudhuri-Hocquenghem (BCH), can be used. The word produced by the ECC encoder in a single encoding operation, in accordance with the rules defining the underlying code, is also referred to as a code word (CW).

Data read from a group of memory cells may contain one or more errors. The number of errors typically increases when the read threshold used for sensing the memory cells is positioned non-optimally. A read operation fails, for example, when the number of errors in the read data exceeds the ECC capabilities.

Memory controller 40 may be implemented in hardware, e.g., using one or more Application-Specific Integrated Circuits (ASICs) or Field-Programmable Gate Arrays (FPGAs). Alternatively, the memory controller may comprise a microprocessor that runs suitable software, or a combination of hardware and software elements.

The configuration of FIG. 1 is an example memory system configuration, which is shown purely for the sake of conceptual clarity. Any other suitable memory system configuration can also be used. For example, although the example of FIG. 1 shows a single memory device, in alternative embodiments memory controller 40 may control multiple memory devices 24. Elements that are not necessary for understanding the principles of the present disclosure, such as various interfaces, addressing circuits, timing and sequencing circuits and debugging circuits, have been omitted from the figure for clarity.

In the example memory system configuration shown in FIG. 1, memory device 24 and memory controller 40 are implemented as two separate Integrated Circuits (ICs). In alternative embodiments, however, the memory device and the memory controller may be integrated on separate semiconductor dies in a single Multi-Chip Package (MCP) or System on Chip (SoC), and may be interconnected by an internal bus. Further alternatively, some or all of the memory controller circuitry may reside on the same die on which the memory array is disposed. Further alternatively, some or all of the functionality of memory controller 40 can be implemented in software and carried out by a processor such as processor 48 or other element of the host system. In some embodiments, host 52 and memory controller 40 may be fabricated on the same die, or on separate dies in the same device package.

In some embodiments, processor 48 of memory controller 40 comprises a general-purpose processor, which is programmed in software to carry out the functions described herein. The software may be downloaded to the processor in electronic form, over a network, for example, or it may, alternatively or additionally, be provided and/or stored on non-transitory tangible media, such as magnetic, optical, or electronic memory.

In an example configuration of memory array 28, memory cells 32 are arranged in multiple rows and columns, and each memory cell comprises a floating-gate transistor. The gates of the transistors in each row are connected by word lines, and the sources of the transistors in each column are connected by bit lines. The memory array is typically divided into multiple memory pages, i.e., groups of memory cells that are programmed and read simultaneously.

In the example of FIG. 1, the memory cells are arranged in a Three-Dimensional (3D) configuration. In such embodiments, the memory cells are arranged in multiple strings 58, wherein each WL comprises memory cells of multiple different strings.

In some embodiments, memory pages are sub-divided into sectors. Data pages may be mapped to word lines in various manners. Each word line may store one or more data pages. A given data page may be stored in all the memory cells of a word line, or in a subset of the memory cells (e.g., the odd-order or even-order memory cells). To access a specific word line or data page, the memory device is provided with a respective physical address.

Erasing of the memory cells in memory array 28 is usually carried out in blocks that contain multiple memory pages. Typical memory devices may comprise thousands of erasure blocks, also referred to as "memory blocks" 34. In a typical two-dimensional (2D) two-bit-per-cell MLC device, each erasure block is on the order of 128 word lines, each comprising several tens of thousands of memory cells. Two-bit-per-cell devices having 128 word lines per erasure block that store a data page per bit-significance value would have 256 data pages per erasure block, and three-bit-per-cell devices would have 384 data pages per block. A typical three-dimensional (3D) device that stores three bits per cell may comprise, for example, 4 strings per block, wherein each string comprises several thousand layered columns that each comprises 48 layers of cell columns. Such a 3D device has 12 data pages per a physical word line, or 576 data pages per an erasure block. Alternatively, other block sizes and configurations can also be used.

Impairments that Cause Severe Errors to Data Units of Selected Bit-Significance Values Nonvolatile memories may suffer from various types of impairments that typically cause a large number of errors in reading stored data, e.g., beyond the error correction capabilities of ECC 50. Impairments resulting in severe reliability degradation may result, for example, due to physical defects in the storage array created at manufacturing time, or develop during the lifetime of the memory device. Alternatively or additionally, storage reliability may degrade due to varying environmental conditions such as temperature.

In the present context, we refer mainly to impairments in which data units of different bit-significance values experience different severity levels of degradation. Such impairments may affect multiple WLs that are physically close to one another in the memory array, e.g., due to short circuit.

Figure 2A:
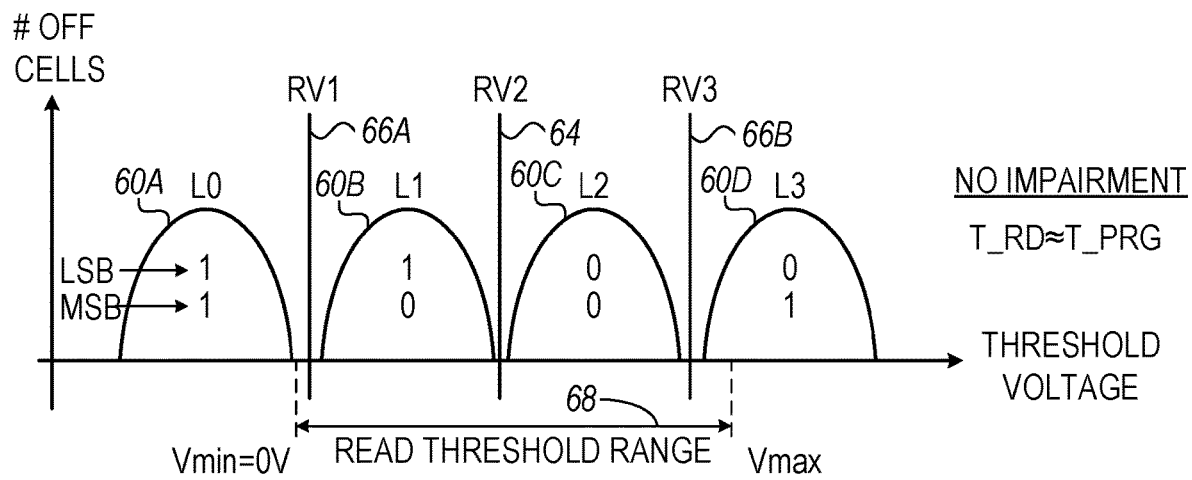
FIG. 2A is a diagram that schematically illustrates threshold voltage distributions in a group of memory cells, prior to and after being affected by erase penetration impairment, in accordance with an embodiment that is described herein.
Figure 2A:
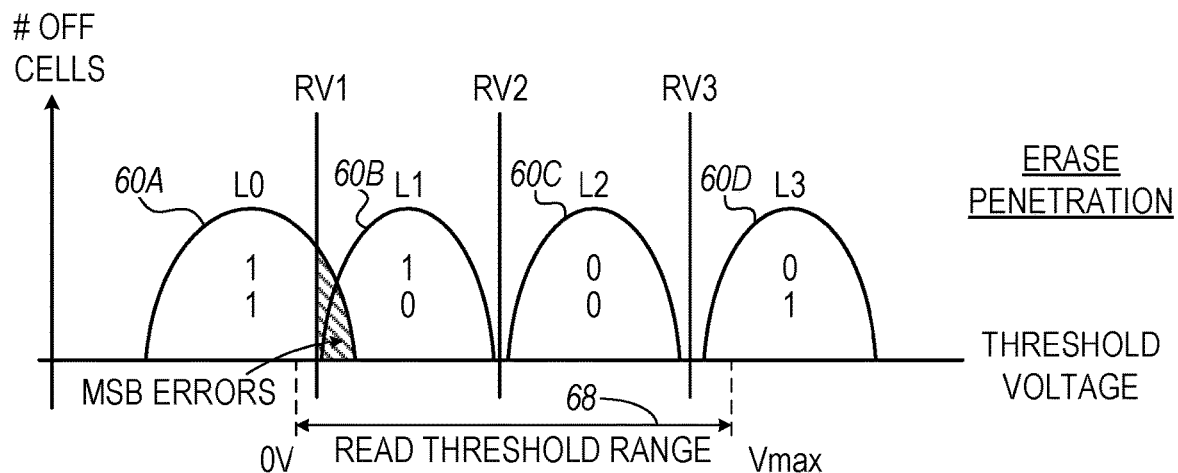
Figure 2B:
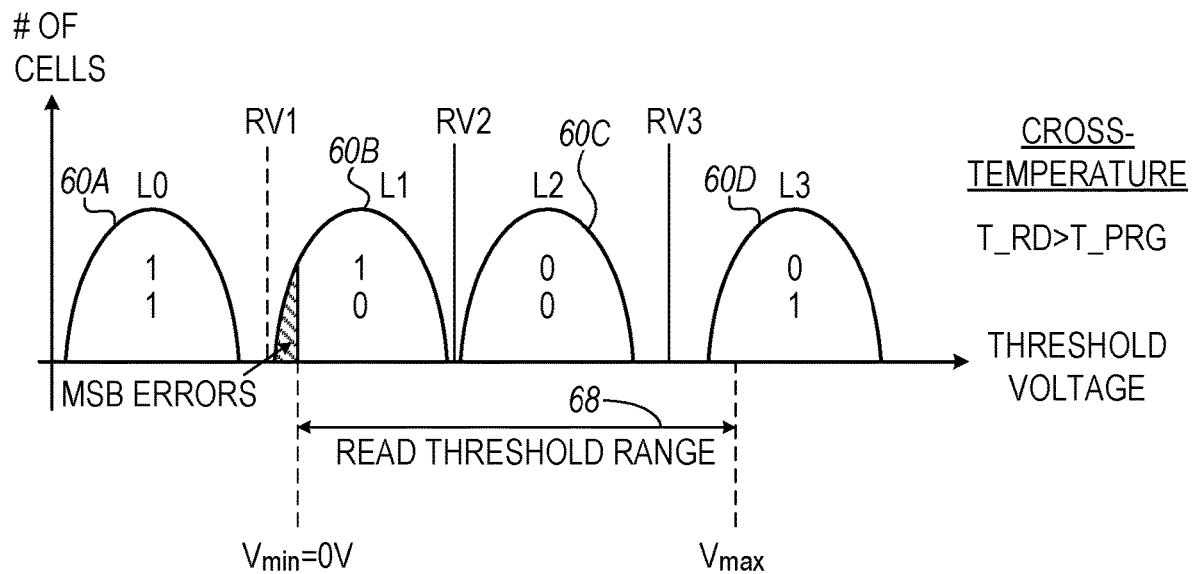
FIG. 2B is a diagram that schematically illustrates threshold voltage distributions in a group of memory cells that are affected by cross-temperature impairment, in accordance with an embodiment that is described herein.
Figure 2B:
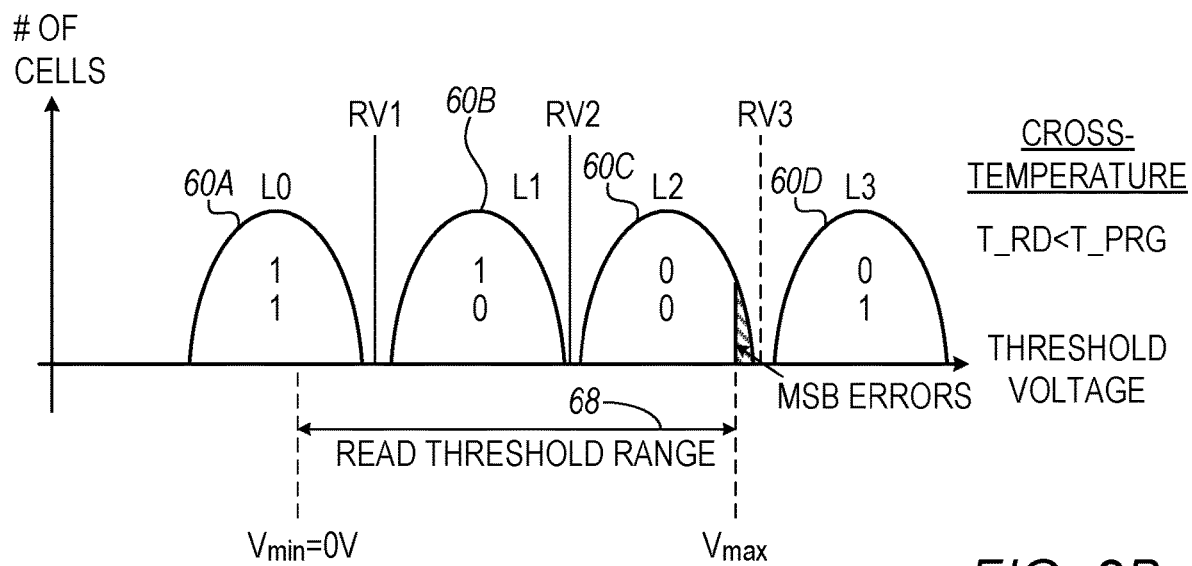

FIG. 2A is a diagram that schematically illustrates threshold voltage distributions in a group of memory cells, prior to and after being affected by erase penetration impairment, in accordance with an embodiment that is described herein. FIG. 2B is a diagram that schematically illustrates threshold voltage distributions in a group of memory cells that are affected by cross-temperature impairment, in accordance with an embodiment that is described herein. The description of FIGS. 2A and 2B refers to memory device 24 of memory system 20, configured as a MLC device that stores 2 bits/cell.

Consider a group of memory cells 32 in which a least significant bit (LSB) data page and a most significant bit (MSB) data page are stored. The diagrams in FIGS. 2A and 2B depict four programming levels denoted L0 . . . L3 corresponding to respective threshold voltage distributions 60A . . . 60D. Distributions of this sort apply to suitable data units other than data pages, such as for example, code words.

Each of programming levels L0 . . . L3 corresponds to a pair of bits comprising a LSB and a MSB. In the present example, in storing data to the group of the memory cells, the memory controller encodes 2-bit groups into the four programming levels using a Gray code so that only one bit-significance value changes between neighboring programming levels. In this example, programming level L0 is assigned to erased memory cells and is associated with (LSB, MSB) bit pair '11', whereas programming levels L1, L2 and L3 correspond to respective (LSB, MSB) bit pairs '10', '00' and '01', thus implementing a Gray code.

As noted above, reading the memory cells of memory device 24 typically involves setting one or more read thresholds and sensing the threshold voltages of the memory cells being read. In FIGS. 2A and 2B, a read threshold depicted as a vertical line 64 (denoted RV2) is used for reading LSB data pages, whereas read thresholds depicted as vertical lines 66A and 66B (denoted RV1 and RV3, respectively) are used for reading MSB data pages. In some embodiments, the memory device supports setting read thresholds only within a predefined voltage range 68. In FIGS. 2A and 2B, voltage range 68 resides between threshold voltages denoted Vmin and Vmax, wherein in this example, Vmin=0V.

In FIGS. 2A and 2B, the memory cells in the relevant group are programmed at a temperature denoted T_PRG and read at a temperature denoted T_RD. In FIG. 2A the memory cells are programmed and read at similar temperatures, whereas in FIG. 2B the memory cells are programmed and read at different temperatures, as will be described below.

The upper diagram in FIG. 2A refers to a situation in which the memory cells suffer no impairments. In the upper diagram of FIG. 2A, the reading thresholds RV1, RV2 and RV3 are configured to their respective optimal levels, typically at some middle threshold voltage between the relevant programming levels. Optimal settings of the read thresholds result, for example, in a minimal number of errors in a readout result from the memory array. In FIG. 2A, all the read thresholds fall within voltage range 68. Moreover, the lower tail of L1 and the upper tail of L2 also fall within read threshold voltage range 68, which typically maintains the number of readout errors in reading an LSB page or a MSB page within the error correction capabilities of ECC 50.

The lower diagram in FIG. 2A refers to an erase penetration failure mode. As seen in this diagram, the threshold voltages of some erased memory cells of programming level L0 are shifted to higher levels that exceed RV1. Such memory cells will therefore read erroneously as MSB=0 instead of MSB=1. The reading of the MSB data page may fail, when a large number of the memory cells storing that MSB data page are affected by the erase penetration impairment.

As noted above, FIG. 2B refers to cases in which the memory cells are programmed at a temperature T_PRG but are later read at a different temperature T_RD. The upper diagram of FIG. 2B refers to reading at a temperature T_RD that is much higher than T_PRG (e.g., T_PRG=0° C. and T_RD=85° C.). As a result, at the time of reading, the threshold-voltage distributions are shifted towards lower voltage values of the threshold voltage axis. Therefore, the optimal read threshold RV1 now falls outside voltage range 68. As a result, the threshold voltages of some of the memory cells that were programmed to L1 at temperature T_PRG now fall between RV1 and the lower boundary of voltage range 68 (e.g., 0V) and will be read as MSB=1 instead of MSB=0. In such situations, the number of errors in reading the MSB data page exceeds the error correction capabilities of the ECC with high probability, in which case the MSB data page is unrecoverable from the MSB readout result.

A similar scenario occurs in the lower diagram of FIG. 2B, in which T_RD<T_PRG (e.g., T_PRG=85° C. and T_RD=0° C.). In this case, the threshold-voltage distributions shift to higher threshold voltages, which may cause the optimal read threshold RV3 to fall outside voltage range 68, above Vmax. In this case too, the MSB page may be unrecoverable from the MSB readout result.

In the FIGS. 2A and 2B memory cells that store 2 bits/cell may suffer from an erase penetration or cross-temperature impairment. Such impairments may affect memory devices of higher storage densities such as TLC and QLC devices, in a similar manner to the MLC case of FIGS. 2A and 2B.

Although in FIGS. 2A and 2B, an MSB page read failure occurs due to the impairments, in other embodiments, the reading of data pages of other bit-significance values may be degraded. For example, in a TLC device, data pages of different bit-significance values may suffer from cross-temperature impairment, when reading at respective lower or higher temperatures relative to the temperature at programming.

Efficient Recovery Schemes

In some embodiments, memory controller 40 applies to the memory device 24 a data recovery scheme by assigning to data units stored in the memory device a predefined number of parity groups. A data unit for a given bit-significance value may be stored in memory cells of an entire WL, a data page, a code word of the underlying ECC, or any other suitable type of data unit. In some embodiments, a data unit comprises multiple code words, or multiple page types.

In some embodiments, the memory controller calculates a redundancy over multiple data units that belong to a common parity group. The memory controller calculates respective redundancy data for each parity group, for example, by applying a bitwise XOR operation over multiple data units belonging to the parity group in question. The memory controller stores the resulting redundancy data, for example, in a memory block containing one or more of the data units that were used for calculating the redundancy data, or in a different memory block.

To recover a data unit whose reading has failed, the memory controller (i) reads other data units of the parity group assigned to the failing data unit that were used in calculating the redundancy data (ii) reads the relevant redundancy data and (iii) applies a bitwise XOR operation over the read data units and the redundancy data. Such a recovery method requires that all of the other data units and the redundancy data are retrieved correctly from the memory array.

Figure 3:
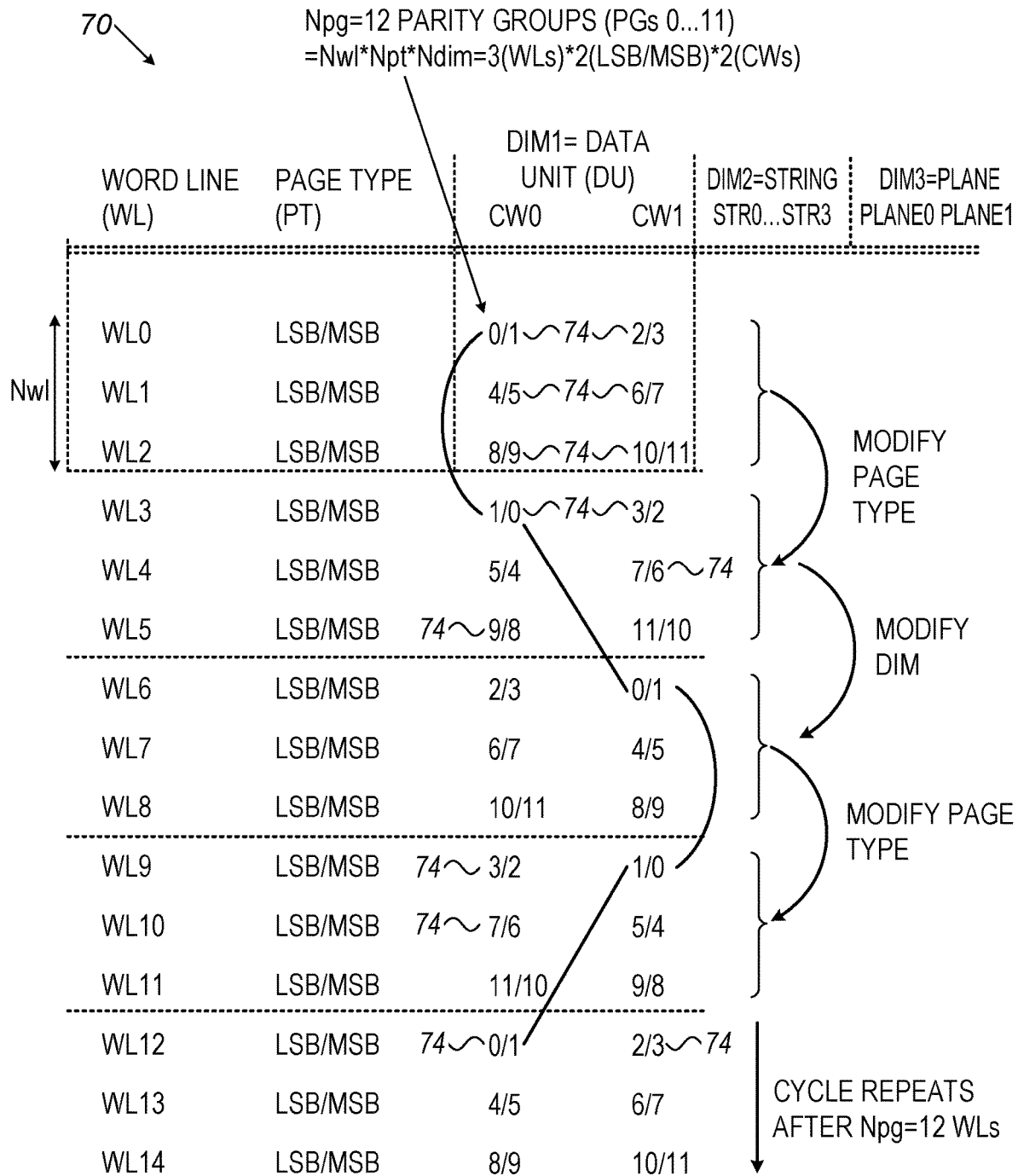
FIG. 3 is a diagram that schematically illustrates a data recovery scheme in which parity groups are assigned to data units over multiple bit-significance values and one or more dimension types, in accordance with an embodiment that is described herein.

FIG. 3 is a diagram that schematically illustrates a data recovery scheme 70 in which parity groups are assigned to data units over multiple bit-significance values and one or more dimension types, in accordance with an embodiment that is described herein. FIG. 3 refers to memory device 24 of memory system 20, configured as a MLC device that stores 2 bits/cell. As such, the memory controller stores both LSB and MSB data in a group of memory cells that belong to a common WL. In addition, the memory cells may suffer from impairments whose severity depend on bit-significant value, e.g., as described in FIGS. 2A and 2B above.

In some embodiments, the memory controller defines recovery scheme 70 by assigning parity groups 74 to data units stored, wherein each data unit is associated with a bit-significance value. The bit-significance value is also referred to herein as a "page type", denoted "PT" in the figure. In the present MLC example, the page types supported comprise bit-significance values LSB and MSB.

In recovery scheme 70, each WL is associated with one or more dimension types. A dimension type (denoted DIM in the figure) comprises, for example, a data unit, a memory string or a memory plane. In FIG. 3, the data unit dimension type is denoted DIM1=DATA UNIT, the string dimension type is denoted DIM2=STRING, and the plane dimension type is denoted DIM3=PLANE. Each of the dimension types may comprise one or more dimension values. In FIG. 3, the DATA UNIT (DU) dimension type has two dimension values denoted CW0 and CW1 corresponding to two code words stored in a common WL. In alternative embodiments, other data units can be used, such as, for example, one or more data pages stored in a common WL.

In some embodiments, the recovery scheme in FIG. 3 comprises other dimension types, such as the STRING or the PLANE dimension type. The STRING dimension type may comprise, for example four dimension values denoted STR0 . . . STR3 corresponding to four strings coupled to a common WL. The PLANE dimension type comprises, for example, two dimension values denoted PLANE0 and PLANE1, corresponding to two planes that share a common WL. Alternatively or additionally, any other suitable dimension types with respective dimension values can also be used. In the present context, the term "dimension type" refers to (i) a physical attribute of memory array that is physically related to a given WL or (ii) a logical attribute related to data segmentation performed by the memory controller.

In some embodiments, the memory controller defines recovery scheme 70 by assigning different parity groups to a plurality of data units in a number Nwl of consecutive WLs. In the present example, the memory controller assigns 12 parity groups denoted 0 . . . 11 to LSB and MSB data units over three consecutive WLs (Nwl=3) and two code words, as depicted by a dotted line rectangle that includes WL0, WL1 and WL2. For example, LSB CW0 and LSB CW1 in WL0 are assigned respective parity groups 0 and 2. As another example, MSB CW0 and MSB CW1 in WL1 are assigned respective parity groups 5 and 7. In the present example, the total number of parity groups, denoted Npg, is given by:

$$Npg = Nwl \cdot Npt \cdot Ndim \qquad \text{Equation 1:}$$

wherein Nwl denotes the number of consecutive WLs over which the parity groups are defined, Npt denotes the number of page types (bit-significance values) used, and Ndim denotes the number of dimension values. In FIG. 3, Nwl=3, Npt=2 (LSB/MSB) and Ndim=2 (CW0, CW1), resulting in Npg=12.

In the present context, the term "pattern" refers to an order in which the Npg parity groups are assigned to data units over bit-significance values and physical dimensions in a group of Nwl consecutive WLs. The pattern initially assigned to a group of Nwl consecutive WLs (e.g., WL0 ... WL2) is referred to herein as a "default pattern."

In FIG. 3, 12 (Npg) parity groups are assigned over the group of 3 (Nwl) consecutive WLs—WL0 ... WL2. Supporting data recovery in additional WLs can be specified in various ways. In an example embodiment, the default pattern assigned to the data units in WL0 ... WL2 is repeated over subsequent groups of Nwl=3 consecutive WLs (not shown). In such an embodiment, the recovery scheme supports the recovery (with high probability) of data units that fail within Nwl consecutive WLs.

In some embodiments, the memory controller defines the recovery scheme, by assigning permutations of the default pattern defined over WL0 ... WL2, to data units in subsequent groups of Nwl consecutive WLs. In the example of FIG. 3, LSB and MSB data units are assigned alternating parity groups in WLs that are separated by Nwl indices from one another. For example, LSB and MSB data units are assigned alternating parity groups 0 and 1 between the WL groups WL0-WL3, WL3-WL6, WL6-WL9, and so on. Similarly, LSB and MSB data units are assigned alternating parity groups 6 and 7 between WL1-WL4, WL4-WL7, WL7-WL10, and so on.

In some embodiments, the pattern of assigning parity groups to data units in a subsequent group of Nwl consecutive WLs uses the same bit-significance value as the default pattern, but modifies one dimension value. Such permutations apply, for example, in WLs whose indices are separated by K·Nwl WLs, wherein K is an integer number and 2≤K. In the example of FIG. 3, the parity groups 0/1 assigned to LSB/MSB in CW0 of WL0 in the default pattern, are assigned to LSB/MSB in CW1 of WL6, and again to LSB/MSB in CW0 of WL12. In this case the relevant WLs are separated from one another by 2·Nwl WLs.

By assigning parity groups to data units using one or more permutations of a default assignment pattern, a cycle of the recovery scheme can be extended beyond Nwl consecutive WLs. For example, by modifying the page type between neighboring groups of Nwl consecutive WLs, the cycle of the recovery scheme extends from Nwl consecutive WLs to Npt·Nwl consecutive WLs, e.g., to 2·Nwl in the example of FIG. 3. In addition, by modifying also one dimension value between groups of 2·Nwl consecutive WLs, the scheme in FIG. 3 extends the cycle to Npt·Ndim·Nwl=4·Nwl consecutive WLs. The cycle captures a number of consecutive WLs in which the data units are recoverable with high probability. In the example of FIG. 3, one cycle of the recovery scheme covers WL0 ... WL11, and repeats starting at WL12.

The recovery scheme of FIG. 3 was given by way of example, and other suitable recovery schemes can also be used. In an example embodiment, for a MLC device that stores four CWs per WL, the memory controller would assign, in WL0, parity groups (0/1), (2/3), (4/5) and (6/7) to respective LSB/MSB code words CW0, CW1, CW2 and CW3 (not shown).

The memory device in FIG. 3, comprises a MLC device that stores LSB and MSB data units. In an alternative embodiment, the memory device stores a number of bits per cell higher than two, such as a TLC and QLC that store 3 bits and 0bits per cell, respectively. In a TLC device, the memory controller would define three page types LSB/MSB/USB. In this case, CW0 and CW1 in WL0 are assigned parity groups 0/1/2 and 3/4/5, respectively (not shown).

In some embodiments, the recovery scheme is specified for a single dimension type, such as the DATA UNIT dimension in FIG. 3. A recovery scheme similar to the one in FIG. 3, in which another dimension type replaces the DATA UNIT dimension type, e.g., the STRING or PLANE dimension type, can also be used. When the recovery scheme is specified over multiple different dimension types, the factor Ndim in calculating Npg using Equation 1 above equals the total number of permutations over the different dimension types.

A recovery scheme that is specified over multiple different dimension types may be specified, e.g., over both the DATA UNIT and STRING dimension types. In such embodiments, between selected neighboring groups of Nwl consecutive WLs, (i) only one dimension type is modified, or (ii) multiple dimension types are modified together. Example recovery schemes that are defined for both the DATA UNIT dimension type and the STRING dimension type are depicted in Table 1 and Table 2 below. In this example, the DATA UNIT dimension type has dimension values CW0 and CW1, and the STRING dimension type has dimension values STR0 and STR1. For the sake of clarity, Table 1 and Table 2 include only the first WLs in the respective groups of 3 consecutive WLs, in this case, WL0, WL3, WL6, WL9 and so on.

TABLE 1

Recovery scheme with single dimension type modification

|  | STR0 | | STR1 | |
| --- | --- | --- | --- | --- |
| WL | CW0 LSB/MSB | CW1 LSB/MSB | CW0 LSB/MSB | CW1 LSB/MSB |
| WL0 | 0/1 | 2/3 | 4/5 | 6/7 |
| WL3 | 1/0 | 3/2 | 5/4 | 7/6 |
| WL6 | 4/5 | 6/7 | 0/1 | 2/3 |
| WL9 | 5/4 | 7/6 | 1/0 | 3/2 |
| WL12 | 0/1 | 2/3 | 4/5 | 6/7 |

As seen in Table 1, the parity group assigned to LSB/MSB data units alternates between 0/1 and 1/0 between WL0, WL3, WL6, WL9 and so on. In addition, the 0/1 assignment in CW0, is modified from STR0 in WL0 to STR1 in WL6.

TABLE 2

Recovery scheme with double dimension type modification

|  | STR0 | | STR1 | |
| --- | --- | --- | --- | --- |
| WL | CW0 LSB/MSB | CW1 LSB/MSB | CW0 LSB/MSB | CW1 LSB/MSB |
| WL0 | 0/1 | 2/3 | 4/5 | 6/7 |
| WL3 | 5/4 | 7/6 | 1/0 | 3/2 |
| WL6 | 0/1 | 2/3 | 4/5 | 6/7 |
| WL9 | 5/4 | 7/6 | 1/0 | 3/2 |

In Table 2, in the transition from WL0 to WL3, the LSB/MSB assignment of parity groups 0/1 in STR0 is modified to 1/0 in STR1, so that both the page type and the string are modified together.

Figure 4:
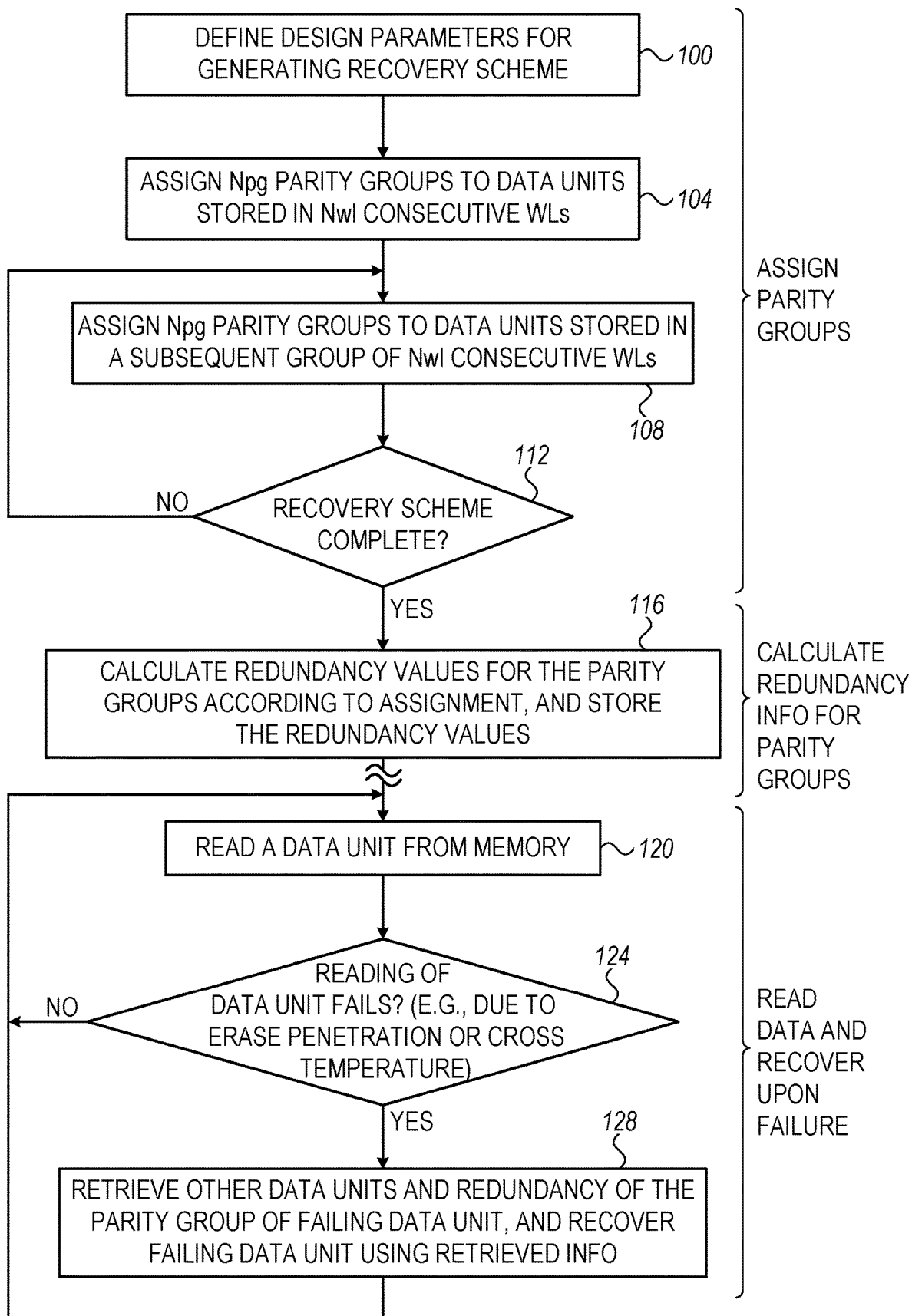
FIG. 4 is a flow chart that schematically illustrates a method for recovering data units that fail due to an impairment whose severity depends on bit-significance value, in accordance with an embodiment that is described herein.

Methods for Recovering Data that Fails Due to Impairment Whose Severity Depends on Bit-Significance Value FIG. 4 is a flow chart that schematically illustrates a method for recovering data units that fail due to an impairment whose severity depends on bit-significance value, in accordance with an embodiment that is described herein. The method is described as being executed by processor 48 of memory controller 40 that is coupled to memory device 24 in FIG. 1 above.

The method begins with processor 48 defining (or receiving) design parameters required for constructing a recovery scheme, at a parameter definition step 100. The design parameters comprise, for example, the number Npg of parity groups, the default pattern of assigning parity groups to data units over Nwl consecutive WLs, and one or more dimension types and their respective dimension values. At step 100, the processor additionally specifies assignment rules to be applied among multiple groups of Nwl consecutive WLs. The assignment rules specify, for example, the order in which a given parity group is assigned across multiple dimension types. An example recovery scheme 70 was described in FIG. 3 above.

At an initial assignment step 104, the processor assigns the Npg parity groups to data units of multiple bit-significance values in accordance with the default pattern. In some embodiments, based on the design parameters, the processor calculates the total number of consecutive WLs in one cycle of the recovery scheme. The number of WLs in the cycle is an integer multiple of Nwl.

At a loop assignment step 108, the processor assigns parity groups to data units of a subsequent group of Nwl consecutive WLs. Typically, at step 108 the indices of the respective first WLs in the previous and current groups of Nwl consecutive WLs differ by Nwl. At a loop termination step 112, the processor checks whether the recovery scheme is complete, and if not, loops back to step 108 to assign parity groups to data units in a subsequent group of Nwl consecutive WLs. The processor may check, for example, whether the total number of WLs in a full cycle of the recovery scheme has been processed.

When at step 112, the recovery scheme is complete, the processor proceeds to a redundancy calculation step 116. At step 116, the processor calculates Npg redundancy values, i.e., a respective redundancy value for each of the Npg parity groups, over multiple data units stored in multiple WLs and that share the same parity group, in accordance with the recovery scheme. For example, when using the recovery scheme of FIG. 3, the processor calculates a redundancy value for parity group 0 by calculating a logical bitwise XOR operation among the data units CW0-LSB in WL0, CW0-MSB in WL3, CW1-LSB in WL6, CW1-MSB in WL9 and so on. The processor stores the Npg redundancy values, for example, in the nonvolatile memory device. At step 116, the processor may calculate the redundancy values over WLs that belong to a single memory block, or to multiple memory blocks.

At a reading step 120, which the processor typically performs at some later time, the processor reads a data unit of some bit-significance value from the memory device. The read operation may fail, for example, due to erase penetration, cross-temperature or any other impairment whose severity level depends on the bit-significance of the data unit read.

At a verification step 124, the processor checks whether the read operation of step 120 has failed, and if not, loops back to step 120 to read another data unit from the memory device. In some embodiments, the processor identifies that reading the data unit has failed, by decoding the read data unit using ECC 50. In other embodiments, the processor may apply any other verification method, such as, for example, receiving from the memory device any suitable read failure indication. When at step 124 the processor detects that the read operation has failed, the processor proceeds to a recovery step 128. At step 128, the processor retrieves from the memory device all of the data units that were used in calculating a corresponding redundancy value. The processor additionally retrieves the relevant redundancy value, and calculates a logical bitwise XOR operation among the retrieved redundancy value and the retrieved data units to reproduce the failing data unit. Following step 128 the processor loops back to step 120, to perform another read operation.

The embodiments describe above are given by way of example, and other suitable embodiments can also be used.

In the embodiments described above, a recovery scheme is designed for protecting data units of various types, such as code words, from read failures caused by impairments whose severity depends on the bit-significance values, e.g., erase penetration and cross-temperature. In alternative embodiments, recovery schemes for recovering failing code words due to other types of impairments can also be used. For example, the parity group assignment in the example recovery scheme of Table 3 below, alternates between CW0 and CW1 and also between PLANE0 and PLANE1, but does not alternate between LSB and MSB.

TABLE 3

A recovery scheme for code words, with no alternation between LSB and MSB

| | PLANE0 | | PLANE1 | |
|---|---|---|---|---|
| WL | CW0 LSB/MSB | CW1 LSB/MSB | CW0 LSB/MSB | CW1 LSB/MSB |
| WL0 | 0/1 | 2/3 | 4/5 | 6/7 |
| WL1 | 8/9 | 10/11 | 12/13 | 14/15 |
| WL2 | 16/17 | 18/19 | 20/21 | 22/23 |
| WL3 | 2/3 | 0/1 | 6/7 | 4/5 |
| WL4 | 10/11 | 8/9 | 14/15 | 12/13 |
| WL5 | 18/19 | 16/17 | 22/23 | 20/21 |
| WL6 | 4/5 | 6/7 | 0/1 | 2/3 |
| WL7 | 12/13 | 14/15 | 8/9 | 10/11 |
| WL8 | 20/21 | 22/23 | 16/17 | 18/19 |
| WL9 | 6/7 | 4/5 | 2/3 | 0/1 |
| WL10 | 14/15 | 12/13 | 10/11 | 8/9 |
| WL11 | 22/23 | 20/21 | 18/19 | 16/17 |

It will be appreciated that the embodiments described above are cited by way of example, and that the following claims are not limited to what has been particularly shown and described hereinabove. Rather, the scope includes both combinations and sub-combinations of the various features described hereinabove, as well as variations and modifications thereof which would occur to persons skilled in the art upon reading the foregoing description and which are not disclosed in the prior art. Documents incorporated by reference in the present patent application are to be considered an integral part of the application except that to the extent any terms are defined in these incorporated documents in a manner that conflicts with the definitions made explicitly or implicitly in the present specification, only the definitions in the present specification should be considered.

The invention claimed is:

1. A controller, comprising:
   an interface, which is configured to communicate with a memory comprising:
   multiple memory cells that store data in a number of programming levels higher than two, wherein the memory cells are organized in multiple Word Lines (WLs), each WL connects to one or more cell-groups of the memory cells,
   wherein the memory cells in some of the cell-groups suffer from an impairment that has a different severity for reading data units of different respective bit-significances; and
   storage circuitry, which is configured to:
   within a plurality of consecutive WLs, define (i) groups of Nwl consecutive WLs, and (ii) multiple parity groups each comprising multiple data units, wherein a given parity group comprises at least first and second data units that (i) differ in bit-significance and (ii) belong to neighboring groups of Nwl consecutive WLs; and
   upon detecting a failure to access a given data unit of the given parity group, due to the impairment, recover the given data unit using one or more other data units assigned to the given parity group, and that are stored in cell-groups other than the cell-group storing the given data unit.

2. The controller according to claim 1, wherein the storage circuitry is configured to calculate redundancy data over the given data unit and the other data units, to store the redundancy data prior to reading the given data unit, and to recover the given data unit upon failure by retrieving the redundancy data and the other data units, and reproducing the given data unit based on the retrieved redundancy data and the other data units.

3. The controller according to claim 1, wherein the impairment is caused due to memory cells in the given cell-group that are erased to an erasure programming level, but are read falsely as being programed to a programming level other than the erasure programming level.

4. The controller according to claim 1, wherein the impairment is caused due to a difference in temperature in programming and reading the memory cells of the given cell-group, causing a shift of an optimal setting of at least one read threshold beyond a voltage range that the memory supports for setting read thresholds.

5. The controller according to claim 1, wherein the data units span a cell-group defined in a list consisting of an entire WL, one or more data pages, and one or more code words (CWs) calculated using an error correction code (ECC).

6. The controller according to claim 1, wherein the storage circuitry is configured to assign a number Npg of different parity groups to Npg respective data units stored in a group of Nwl consecutive WLs, in accordance with a first pattern, and to assign the Npg parity groups to data units stored in another group of Nwl consecutive WLs, in accordance with a second pattern comprising a permutation of the first pattern.

7. The controller according to claim 1, wherein the memory cells in each WL are organized in multiple strings, and wherein the storage circuitry is configured to assign a same parity group to data units belonging to different strings, in selected neighboring groups of Nwl consecutive WLs.

8. The controller according to claim 1, wherein the memory cells in each WL are organized in multiple planes, and wherein the storage circuitry is configured to assign a same parity group to data units belonging to different planes, in selected neighboring groups of Nwl consecutive WLs.

9. The controller according to claim 1, wherein the memory cells in each WL are organized in multiple strings and multiple planes, and wherein the storage circuitry is configured to assign a same parity group to data units belonging to one of (i) different strings and same planes (ii) different planes and same strings or (iii) both different strings and different planes, in selected neighboring groups of Nwl consecutive WLs.

10. A method for data storage, comprising:
    in a controller that communicates with a memory comprising multiple memory cells that store data in a number of programming levels higher than two, wherein the memory cells are organized in multiple Word Lines (WLs), each WL connects to one or more cell-groups of the memory cells,
    wherein the memory cells in some of the cell-groups suffer from an impairment that has a different severity for reading data units of different respective bit-significance values,
    within a plurality of consecutive WLs, define (i) groups of Nwl consecutive WLs, and (ii) multiple parity groups each comprising multiple data units, wherein a given parity group comprises at least first and second data units that (i) differ in bit-significance and (ii) belong to neighboring groups of Nwl consecutive WLs; and
    upon detecting a failure to access a given data unit of a given parity group, due to the impairment, recovering the given data unit using one or more other data units assigned to the given parity group, and that are stored in cell-groups other than the cell-group storing the given data unit.

11. The method according to claim 10, and comprising calculating redundancy data over the given data unit and the other data units, storing the redundancy data prior to reading the given data unit, and recovering the given data unit upon failure by retrieving the redundancy data and the other data units, and reproducing the given data unit based on the retrieved redundancy data and the other data units.

12. The method according to claim 10, wherein the impairment is caused due to memory cells in the given cell-group that are erased to an erasure programming level, but are read falsely as being programed to a programming level other than the erasure programming level.

13. The method according to claim 10, wherein the impairment is caused due to a difference in temperature in programming and reading the memory cells of the given cell-group, causing a shift of an optimal setting of at least one read threshold beyond a voltage range that the memory supports for setting read thresholds.

14. The method according to claim 10, wherein the data units span a cell-group defined in a list consisting of an entire WL, one or more data pages, and one or more code words (CWs) calculated using an error correction code (ECC).

15. The method according to claim 10, wherein assigning the parity groups comprises assigning a number Npg of different parity groups to Npg respective data units stored in a group of Nwl consecutive WLs, in accordance with a first pattern, and assigning the Npg parity groups to data units stored in another group of Nwl consecutive WLs, in accordance with a second pattern comprising a permutation of the first pattern.

16. The method according to claim 10, wherein the memory cells in each WL are organized in multiple strings, and wherein assigning the parity groups comprises assigning a same parity group to data units belonging to different strings, in selected neighboring groups of Nwl consecutive WLs.

17. The method according to claim 10, wherein the memory cells in each WL are organized in multiple planes, and wherein assigning the parity groups comprises assigning a same parity group to data units belonging to different planes, in selected neighboring groups of Nwl consecutive WLs.

18. The method according to claim 10, wherein the memory cells in each WL are organized in multiple strings and multiple planes, and wherein assigning the parity groups comprises assigning a same parity group to data units belonging to one of (i) different strings and same planes (ii) different planes and same strings or (iii) both different strings and different planes, in selected neighboring groups of Nwl consecutive WLs.

* * * * *